United States Patent
Hur et al.

(10) Patent No.: US 8,519,791 B1
(45) Date of Patent: Aug. 27, 2013

(54) FREE-FLY CLASS D POWER AMPLIFIER

(75) Inventors: Joonhoi Hur, Dallas, TX (US); Lei Ding, Plano, TX (US); Rahmi Hezar, Allen, TX (US); Baher S. Haroun, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 29 days.

(21) Appl. No.: 13/416,841

(22) Filed: Mar. 9, 2012

(51) Int. Cl.
*H03F 3/217* (2006.01)

(52) U.S. Cl.
USPC .................. 330/251; 330/10; 330/207 A

(58) Field of Classification Search
USPC ............ 330/251, 207 A, 10, 302, 305, 295, 330/124 R
See application file for complete search history.

(56) References Cited

U.S. PATENT DOCUMENTS

| | | | |
|---|---|---|---|
| 6,882,829 B2 | 4/2005 | Mostov et al. | |
| 7,509,102 B2 | 3/2009 | Rofougaran et al. | |
| 7,733,187 B2 | 6/2010 | Tateoka et al. | |
| 7,831,227 B2 | 11/2010 | Rofougaran et al. | |
| 7,948,312 B2 * | 5/2011 | Cao | 330/251 |

OTHER PUBLICATIONS

"A Switched-Capacitor Power Amplifier for EER/Polar Transmitters," Digest of Technical Papers (ISSCC), 2011, Feb. 20-24, 2011, pp. 428-430 (Yoo, et al.).

* cited by examiner

*Primary Examiner* — Hieu Nguyen
(74) *Attorney, Agent, or Firm* — John R. Pessetto; W. James Brady; Frederick J. Telecky

(57) ABSTRACT

A method is provided. A first enable signal is asserted so as to enable a first driver, where the first driver has a first output and a first parasitic capacitance. A second enable signal is asserted so as to enable a second driver, where the second driver has a second output and a second parasitic capacitance. The first and second outputs are coupled together by a switching network when the second driver is enabled. Pulses from complementary first and second radio frequency (RF) signals are applied to the first driver, where there is a first set of free-fly intervals between consecutive pulses from the first and second RF signals, and pulses from complementary third and fourth RF signals are applied to the second driver, wherein there is a second set of free-fly interval between consecutive pulses from the third and fourth RF signals.

19 Claims, 7 Drawing Sheets

FREE-FLY CLASS D POWER AMPLIFIER

TECHNICAL FIELD

The invention relates generally to a class D amplifier and, more particularly, to a free-fly class D power amplifier (PA).

BACKGROUND

Turning to FIG. 1, an example of a conventional class D PA 100 that is capable of amplitude modulation can be seen. This PA 100 generally comprises drivers 102-1 to 102-N (which are typically inverters), capacitors CI1 to CIN, and a matching network 104. In operation, a predetermined number of capacitors (i.e., capacitor CI1 to CIn) are switched, while the remainder (i.e., capacitors CI(n+1) to CIN) are left "off." This generates an effective capacitance CIEFF that is the sum of the switched capacitor (i.e., CIEFF=CI1+ . . . +CIn) and an effective supply voltage VEFF (i.e., VEFF=VDD*(n/N)). A functionally equivalent circuit having an inverter 106 that represents the drivers 102-1 to 102-N and that includes the effective capacitance CIEFF and effective supply voltage VEFF can be seen in FIG. 2. This allows an output radio frequency (RF) signal RFOUT to be generated from an input RF signal RFIN (which can be amplitude modulated) so as to be applied to the load RL.

A problem with this configuration, however, is that the switching losses is a function of the effective capacitance CIEFF and frequency. These losses can be so significant so as to be prohibitive for many applications, and the efficiency can be very low. In particular, the efficiency of PA 100 may only reach about 54%. Therefore, there is a need for an improved class D PA.

Some other conventional circuits are: Yoo et al., "A Switched-Capacitor Power Amplifier for EER/Polar Transmitters," *IEEE Intl, Solid-State Circuits Conference Digest of Technical Papers (ISSCC)* 2011, Feb. 20-24, 2011, pp. 428-430; U.S. Pat. No. 6,882,829; U.S. Pat. No. 7,509,102; U.S. Pat. No. 7,733,187; and U.S. Pat. No. 7,831,227.

SUMMARY

An embodiment of the present invention, accordingly, provides an apparatus. The apparatus comprises a first driver having a first input, a first output, and a first parasitic capacitance, wherein the first input is configured to receive complementary first and second radio frequency (RF) signals, and wherein there is a first set of free-fly intervals between consecutive pulses from the first and second RF signals; a second driver having a second input, a second output, and a second parasitic capacitance, wherein the second input is configured to receive complementary third and fourth RF signals, and wherein there is a second set of free-fly intervals between consecutive pulses from the third and fourth RF signals; a switch network that is coupled to the first and second outputs and that is configured to couple the first and second outputs together when the second driver is enabled; a first output capacitor that is coupled to the first output; a second output capacitor that is coupled to the second output; and a matching network that is coupled to the first and second output capacitors.

In accordance with an embodiment of the present invention, the switch network further comprises a switch that is coupled between the first and second outputs.

In accordance with an embodiment of the present invention, the apparatus further comprises: a first enable circuit that is coupled to the first driver and that receives the first and second RF signals; a second enable circuit that is coupled to the first driver and that receives the third and fourth RF signals; and a controller that is coupled to the first and second enable circuits so as to provide first and second enable signals and that is coupled to control the switch.

In accordance with an embodiment of the present invention, the first driver further comprises: a PMOS transistor that is coupled to the first enable circuit at its gate and the first output capacitor at its drain; and an NMOS transistor that is coupled to the first enable circuit at its gate and the first output capacitor at its drain.

In accordance with an embodiment of the present invention, the first enable circuit further comprises: a first logic circuit that is coupled to the gate of the PMOS transistor and the controller; and a second logic circuit that is coupled to the gate of the NMOS transistor and the controller.

In accordance with an embodiment of the present invention, the first and second logic circuits further comprise AND gates.

In accordance with an embodiment of the present invention, the first and third RF signals are substantially the same signal, and wherein the second and fourth RF signals are substantially the same signal.

In accordance with an embodiment of the present invention, a method is provided. The method comprises asserting a first enable signal so as to enable a first driver, wherein the first driver has a first output and a first parasitic capacitance; asserting a second enable signal so as to enable a second driver, wherein the second driver has a second output and a second parasitic capacitance; coupling the first and second outputs together when the second driver is enabled; applying pulses from complementary first and second RF signals to the first driver, wherein there is a first set of free-fly intervals between consecutive pulses from the first and second RF signals; and applying pulses from complementary third and fourth RF signals to the second driver, wherein there is a second set of free-fly interval between consecutive pulses from the third and fourth RF signals.

In accordance with an embodiment of the present invention, the step of asserting the first enable signal further comprises: providing the first enable signal to first and second logic circuits; receiving, by the first logic circuit the first RF signal; and receiving, by the second logic circuit the second RF signal.

In accordance with an embodiment of the present invention, the step of asserting the second enable signal further comprises: providing the second enable signal to third and fourth logic circuits; receiving, by the third logic circuit the third RF signal; and receiving, by the fourth logic circuit the fourth RF signal.

In accordance with an embodiment of the present invention, the first, second, third, and fourth logic circuits further comprise AND gates.

In accordance with an embodiment of the present invention, an apparatus is provided. The apparatus comprises a controller that is configured to select an output power level by asserting a set of enable signals from a plurality of enable signals; a plurality of enable circuits, wherein each enable circuit is coupled to the controller so as to receive at least one of the enable signals, and wherein each enable circuit is configured to receive complementary first and second RF signals, and wherein there is a free-fly interval between consecutive pulses from the first and second RF signals for each set; a plurality of drivers, wherein each driver has an input, an output, and a parasitic capacitance, wherein the input of each driver is coupled to at least one of the enable circuits; a switch network that is coupled to the output of each driver and that is coupled to the controller, wherein the couples the outputs of the drivers together based at least in part on the set of enable signals that are asserted to select the output power level; a plurality of output capacitors, wherein each output capacitor is coupled to the output of at least one of the drivers; and a matching network that is coupled to each output capacitor.

In accordance with an embodiment of the present invention, the plurality of drivers are arranged in a sequence, and wherein the switch network further comprises a plurality of switches, wherein each switch is coupled between outputs of consecutive drivers in the sequence.

In accordance with an embodiment of the present invention, each enable circuit further comprises: a first logic circuit that is coupled to the controller so as to receive at least one of the enable signals and that receives the first RF signal; and a second logic circuit that is coupled to the controller so as to receive at least one of the enable signals and that receives the second RF signal.

In accordance with an embodiment of the present invention, each driver further comprises: a PMOS transistor that is coupled at its gate to the first logic circuit of its corresponding enable circuit and that is coupled at its drain to its corresponding output capacitor; and an NMOS transistor that is coupled at its gate to the second logic gate of its corresponding enable circuit and that is coupled at its drain to its corresponding output capacitor.

In accordance with an embodiment of the present invention, the first and second logic circuits further comprise AND gates.

In accordance with an embodiment of the present invention, each switch further comprises a transmission gate.

In accordance with an embodiment of the present invention, each switch further comprises a microelectromechanical systems (MEMS) switch, a relay, or CMOS switch.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
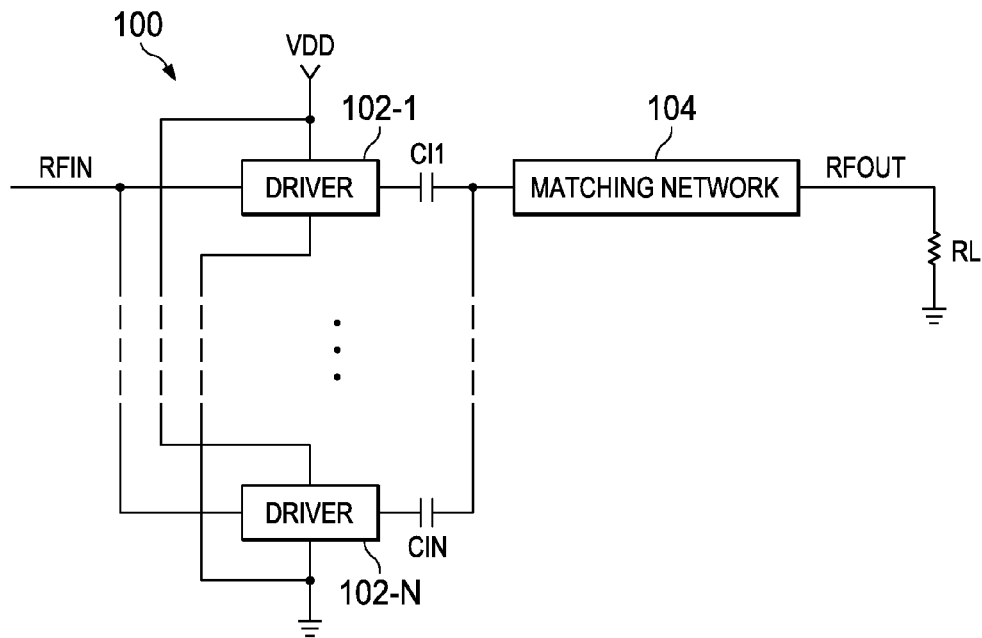
FIG. 1 is a diagram of an example of a conventional class D PA that is capable of amplitude modulation.
Figure 2:
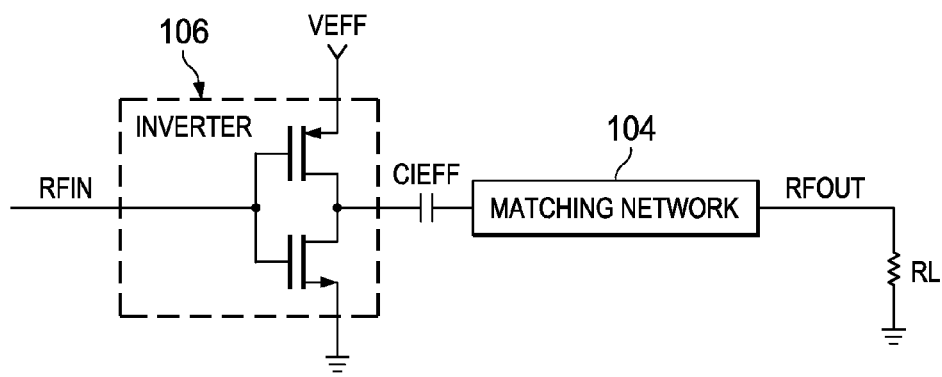
FIG. 2 is a diagram of a functionally equivalent circuit to the PA of FIG. 1.

Refer now to the drawings wherein depicted elements are, for the sake of clarity, not necessarily shown to scale and wherein like or similar elements are designated by the same reference numeral through the several views.

Figure 3:
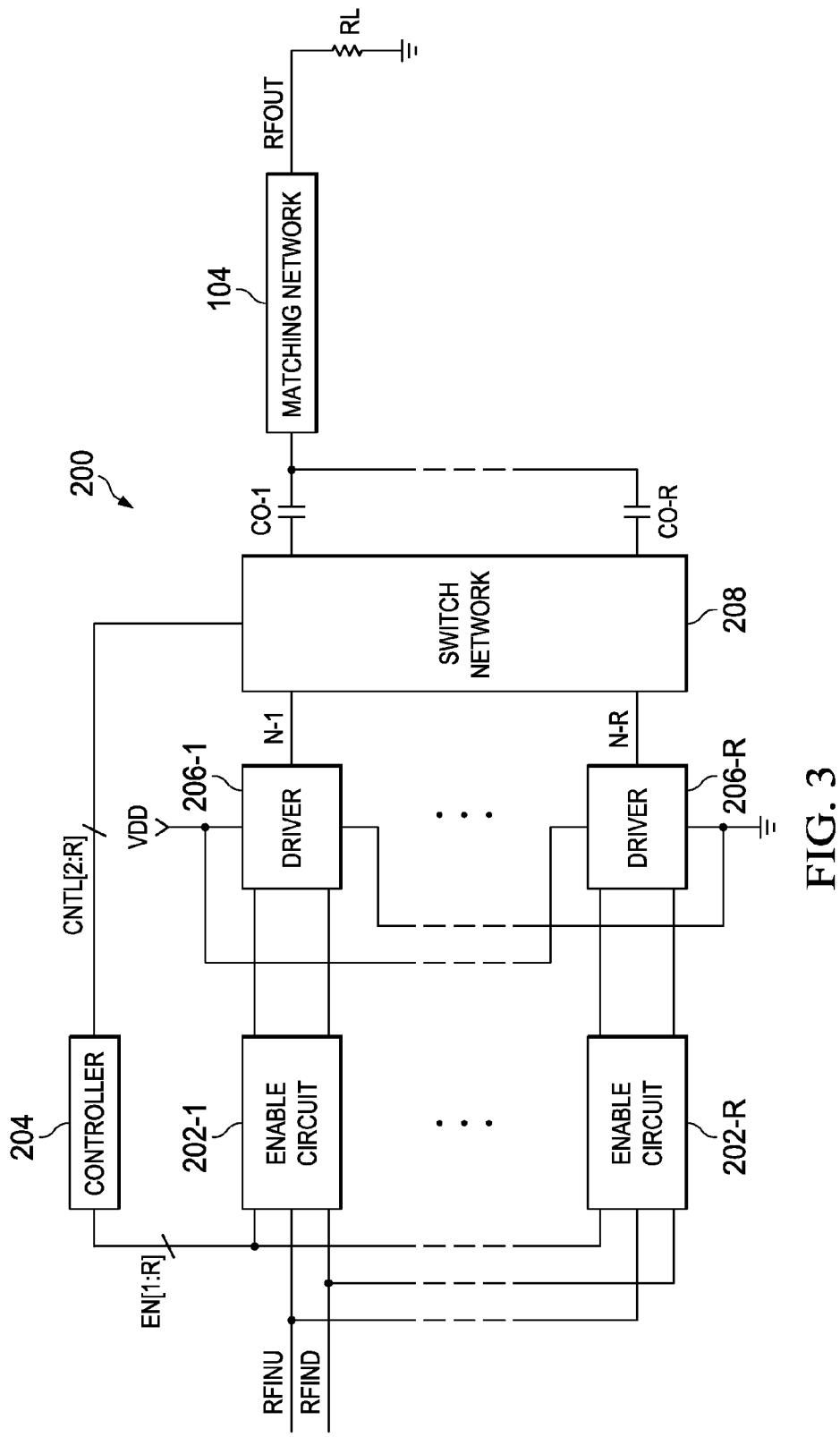
FIG. 3 is a diagram of an example of a PA in accordance with the present invention.
Figure 4:
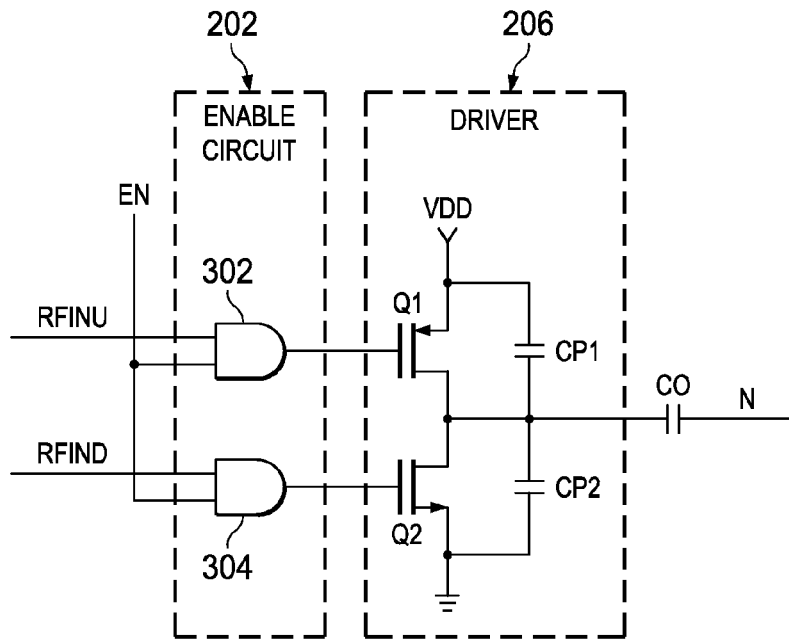
FIG. 4 is a diagram of an example of the enable circuit and driver for the PA of FIG. 3.
Figure 5:
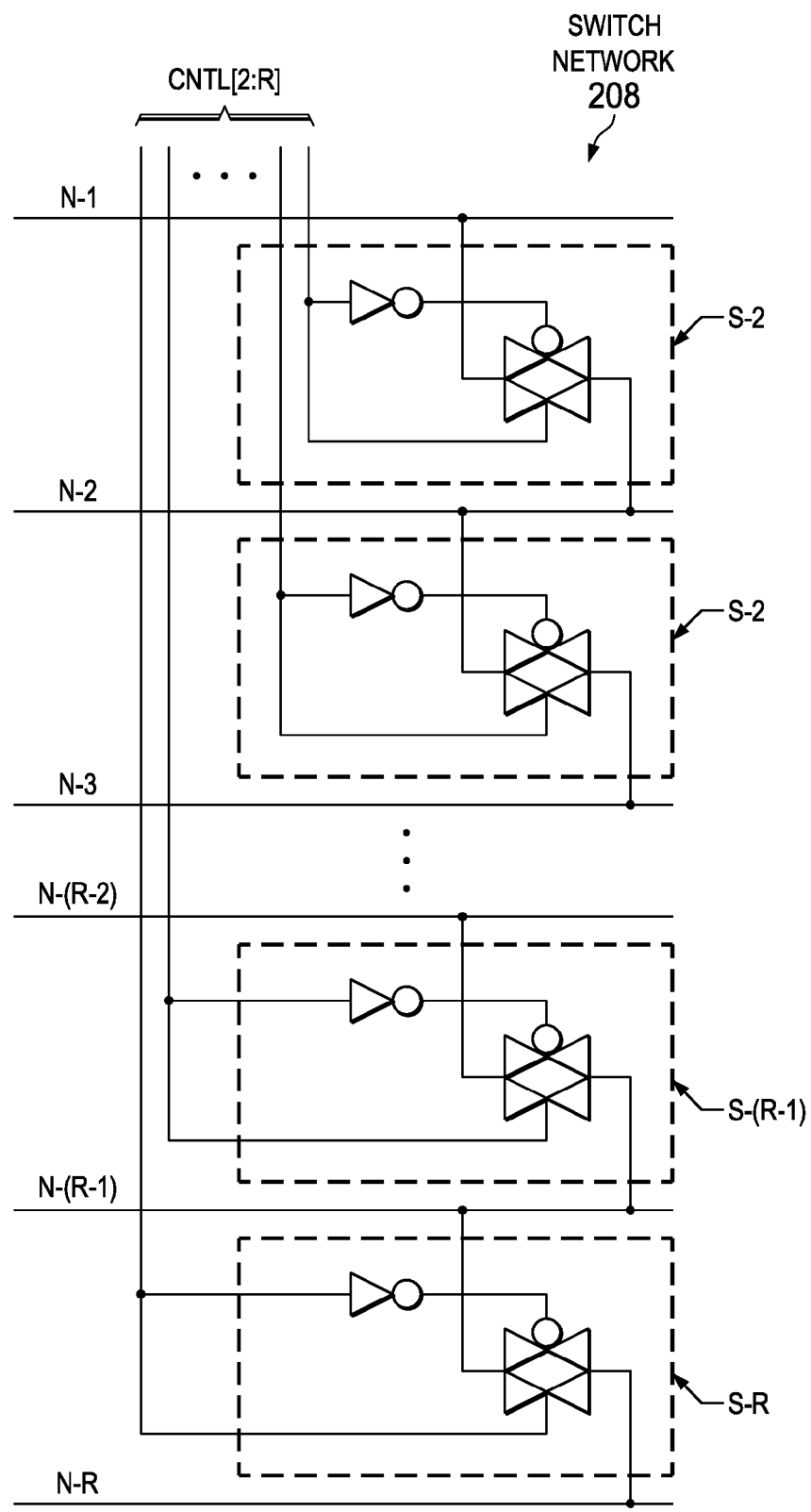
FIG. 5 is a diagram of an example of the switching network of FIG. 3.

Turning to FIGS. 3-5, an example of a class D PA 200 in accordance with an embodiment of the present invention can be seen. As shown, PA 200 is generally comprised of enable circuits 202-1 to 202-R, controller 204, drivers 206-1 to 206-R, a switch network 208, output capacitors CO-1 to CO-N (which can, for example, each have approximately the same capacitance), and a matching network 104. The drivers 206-1 to 206-R are generally comprised of transistors Q1 and Q2 (which are typically PMOS and NMOS transistors, respectively), which, respectively, have parasitic capacitances CP1 and CP2 and which, respectively, receive RF input signals RFINU and RFIND via the logic circuits 302 and 304 (i.e., AND gates or other functionally equivalent logic circuits) of enable circuits 202-1 to 202-R. The switch network or bridge switch 208 generally comprises switches S-2 to S-R (which can, for example, be and are shown as transmission gates) that are each coupled between consecutive or adjacent outputs of drivers 206-1 to 206-R and that are controlled by the signal CNTL[2:R] from controller 204. Also, the matching network 104 may include inductor, capacitors, and resistors. Microelectromechanical system (MEMS) switches, relays, or other CMOS switches may also be employed as switches S-2 to S-R.

In operation, an RF output signal RFOUT is generated and applied to load RL. Typically, the PA 200 has a several output power levels, which are selected by the controller through the activation and deactivation of drivers 202-1 to 202-R with enable signal EN[1:R]. Each enable circuit 202-1 to 202-R typically receives the input RF signals RFINU and RFIND at its input, and, based on the desired output level, a corresponding number of enable circuit 202-1 to 202-R are activated, allowing RF signals RFINU and RFIND to be passed along to the corresponding drivers 206-1 to 206-R. These signals RFINU and RFIND are generally complementary pulse width modulated (PWM) input signals that are able to activate transistors Q1 and Q2 within drivers 206-1 to 206-R, but for PA 200, these signals are not "adjacent" to one another, meaning that these signals are truly complementary from a timing perspective. Between consecutive pulses of the signals RFINU and RFIND, there is a free-fly or dead time interval, meaning that there is an interval between consecutive activations of transistors Q1 and Q2. Because one of the parasitic capacitances CP1 and CP2 is charged as a result of its transistor Q1 or Q2 being "on," the parasitic capacitor CP1 or CP2 creates distortion when it is discharged during this free-fly interval, which has the effect of reducing the interval. This results in an improvement inefficiency by itself.

To better improve efficiency beyond use of the free-fly intervals alone, the parasitic capacitance of the PA 200 can be tuned. Typically, this can be accomplished by activating switches S-2 to S-R in accordance with the desired power level. For example, for a power level of 2, the enable signals EN[1] and EN[2] would be asserted so as to activate enable circuits 202-1 and 202-1, and the control signal CNTL[2] would be asserted to activate or close switch S-2. As another example, for a power level of 4, the enable signals EN[1] to EN[4] would be asserted so as to activate enable circuits 202-1 to 202-4, and the control signal CNTL[2] to CNTL[4] would be asserted to activate or close switch S-2, S-3, and S-4. When these switches S-2 to S-R in switch network 208 are activated in accordance with the desired power level, the parasitic capacitance increases, allowing a desirable (i.e., theoretically optimal) voltage to develop. This, therefore, provides a significant improvement in drain efficiency, especially at power outputs levels lower than a maximum or upper limit.

Figure 6:
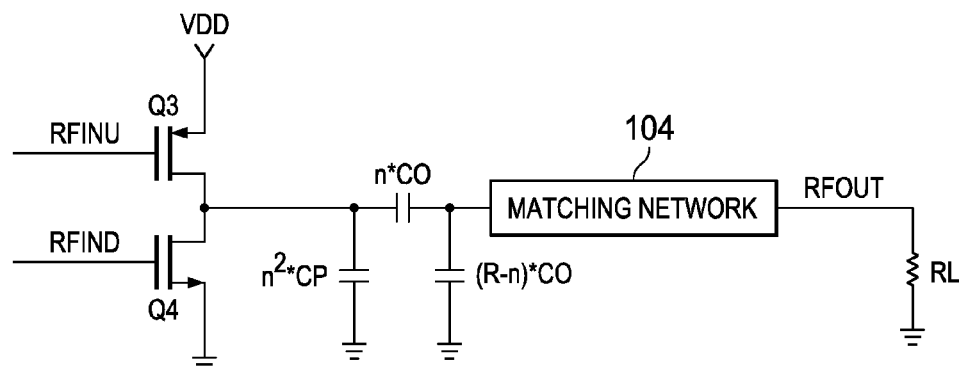
FIG. 6 is a diagram of an example of a functionally equivalent circuit to the PA of FIG. 3.

As an example, in FIG. 6, there is an example of a functionally equivalent circuit of PA 200. For this circuit, transistors Q3 and Q4 represent drivers 206-1 to 206-n, which have been activated or enabled corresponding to a desired power level (denoted "n"). As shown, capacitors CO-1 to CO-n are coupled in parallel with one another, providing a total output capacitance of N*CO. Additionally, because drivers 206-(n+1) to 206-R are inactivated, capacitors CO-(n+1) to CO-R are coupled between matching network 104 and ground. The total parasitic capacitance for power level n is also $n^2 \ast CP$ (as provided through switch network 208) so as to provide the proper RF matching.

Figure 7:
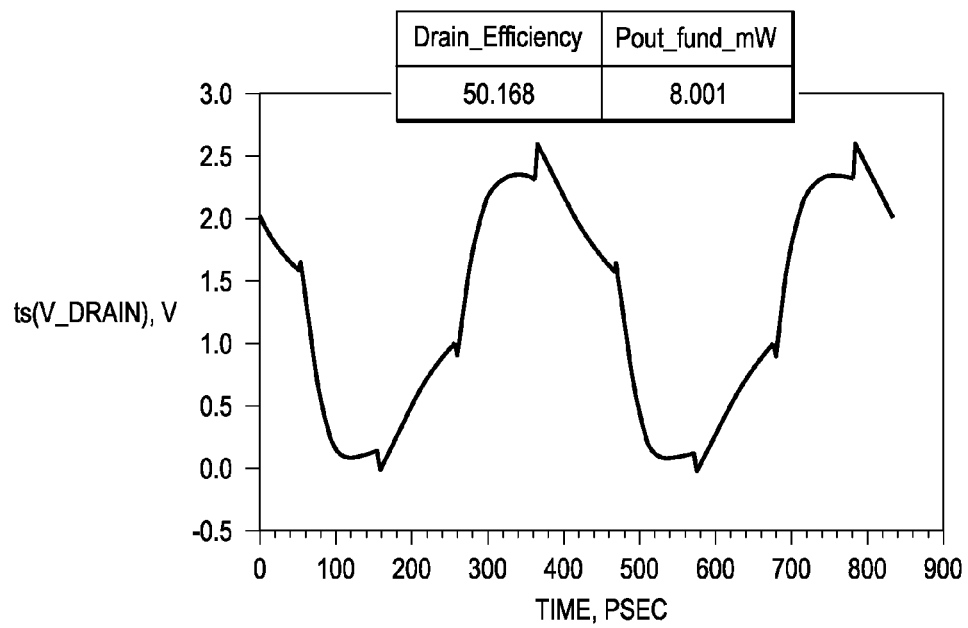
FIGS. 7-10 are diagrams depicting the drain efficiency for an example of the PA of FIG. 3.
Figure 8:
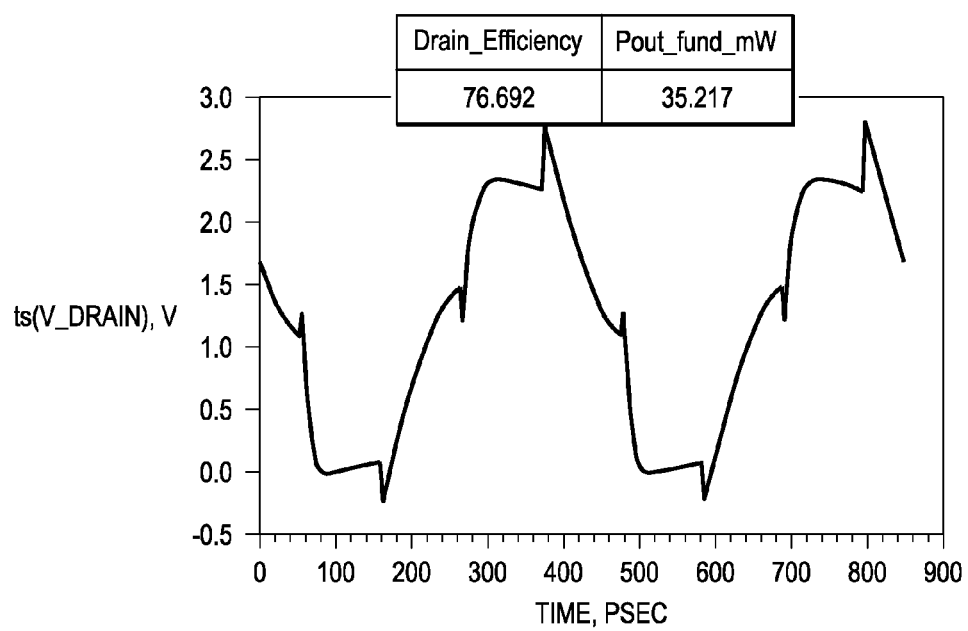
Figure 9:
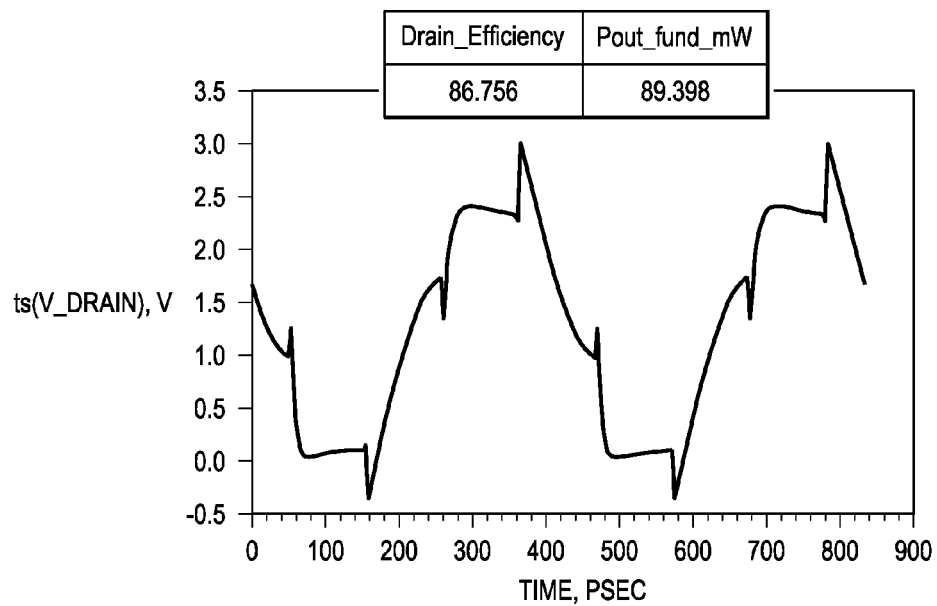
Figure 10:
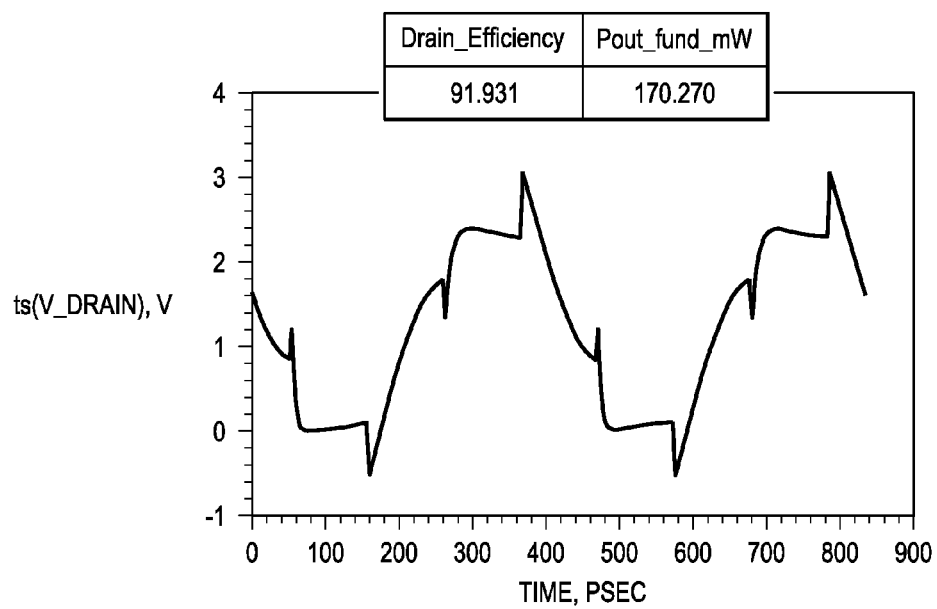
Figure 11:
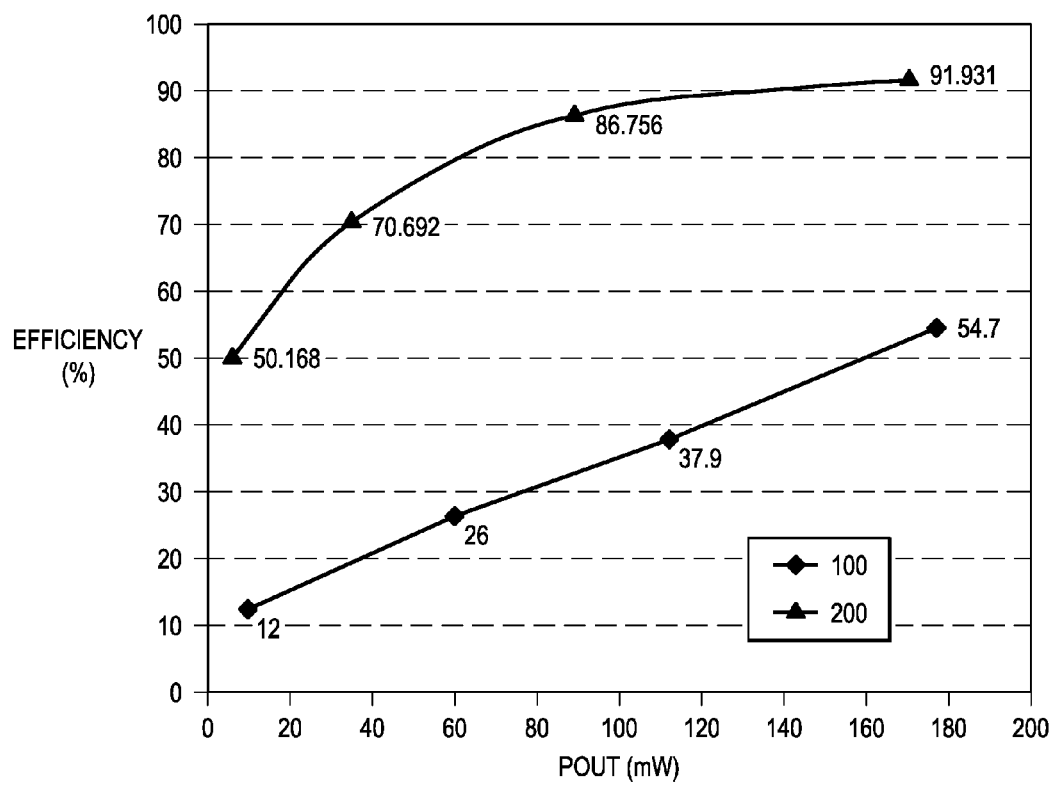
FIG. 11 is a diagram comparing the efficiencies for examples of the PA of FIGS. 1 and 3.

To illustrate, the improvement in efficiency, it can be assumed (as an example) that PA 200 employs four drivers (i.e., 206-1 to 206-4), four enable circuits (i.e., 202-1 to 202-4), and three switches (i.e., S-2 to S4) so as to have four output levels. In this example, for the lowest output level (i.e., level 1), enable circuit 202-1 is activated, so as to provide an output power of about 8 mW. The drain voltage of driver 206-1 for level 1 can be seen in FIG. 7 with a drain efficiency of about 50%. For level 2 (where enable circuits 202-1 and 202-2 and switch S-2 are activated), the output power is about 35 mW, and the drain efficiency (which can be seen in FIG. 8) is about 78%. Similarly, for power levels 3 and 4, the drain efficiency is about 86% and 91% (respectively and which is shown in FIGS. 9 and 10) for output power levels of about 89 mW and about 170 mW (respectively). This improvement in efficiency is dramatically higher than a comparative 4-level PA 100, which can be seen in FIG. 11.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a first driver having a first input, a first output, and a first parasitic capacitance, wherein the first input is configured to receive complementary first and second radio frequency (RF) signals, and wherein there is a first set of free-fly intervals between consecutive pulses from the first and second RF signals;
   a second driver having a second input, a second output, and a second parasitic capacitance, wherein the second input is configured to receive complementary third and fourth RF signals, and wherein there is a second set of free-fly intervals between consecutive pulses from the third and fourth RF signals;
   a switch network that is coupled to the first and second outputs and that is configured to couple the first and second outputs together when the second driver is enabled;
   a first output capacitor that is coupled to the first output;
   a second output capacitor that is coupled to the second output; and
   a matching network that is coupled to the first and second output capacitors.

2. The apparatus of claim 1, wherein the switch network further comprises a switch that is coupled between the first and second outputs.

3. The apparatus of claim 2, wherein the apparatus further comprises:
   a first enable circuit that is coupled to the first driver and that receives the first and second RF signals;
   a second enable circuit that is coupled to the first driver and that receives the third and fourth RF signals;
   a controller that is coupled to the first and second enable circuits so as to provide first and second enable signals and that is coupled to control the switch.

4. The apparatus of claim 3, wherein the first driver further comprises:
   a PMOS transistor that is coupled to the first enable circuit at its gate and the first output capacitor at its drain; and
   an NMOS transistor that is coupled to the first enable circuit at its gate and the first output capacitor at its drain.

5. The apparatus of claim 4, wherein the first enable circuit further comprises:
   a first logic circuit that is coupled to the gate of the PMOS transistor and the controller; and
   a second logic circuit that is coupled to the gate of the NMOS transistor and the controller.

6. The apparatus of claim 5, wherein the first and second logic circuits further comprise AND gates.

7. The apparatus of claim 6, wherein the first and third RF signals are substantially the same signal, and wherein the second and fourth RF signals are substantially the same signal.

8. A method comprising:
   asserting a first enable signal so as to enable a first driver, wherein the first driver has a first output and a first parasitic capacitance;
   asserting a second enable signal so as to enable a second driver, wherein the second driver has a second output and a second parasitic capacitance;
   coupling the first and second outputs together when the second driver is enabled applying pulses from complementary first and second RF signals to the first driver, wherein there is a first set of free-fly intervals between consecutive pulses from the first and second RF signals; and
   applying pulses from complementary third and fourth RF signals to the second driver, wherein there is a second set of free-fly interval between consecutive pulses from the third and fourth RF signals.

9. The method of claim 8, wherein the step of asserting the first enable signal further comprises:
   providing the first enable signal to first and second logic circuits;
   receiving, by the first logic circuit the first RF signal; and
   receiving, by the second logic circuit the second RF signal.

10. The method of claim 9, wherein the step of asserting the second enable signal further comprises:
    providing the second enable signal to third and fourth logic circuits;
    receiving, by the third logic circuit the third RF signal; and
    receiving, by the fourth logic circuit the fourth RF signal.

11. The method of claim 10, wherein the first, second, third, and fourth logic circuits further comprise AND gates.

12. The method of claim 11, wherein the first and third RF signals are substantially the same signal, and wherein the second and fourth RF signals are substantially the same signal.

13. An apparatus comprising:
- a controller that is configured to select an output power level by asserting a set of enable signals from a plurality of enable signals;
- a plurality of enable circuits, wherein each enable circuit is coupled to the controller so as to receive at least one of the enable signals, and wherein each enable circuit is configured to receive complementary first and second RF signals, and wherein there is a free-fly interval between consecutive pulses from the first and second RF signals for each set;
- a plurality of drivers, wherein each driver has an input, an output, and a parasitic capacitance, wherein the input of each driver is coupled to at least one of the enable circuits;
- a switch network that is coupled to the output of each driver and that is coupled to the controller, wherein the couples the outputs of the drivers together based at least in part on the set of enable signals that are asserted to select the output power level;
- a plurality of output capacitors, wherein each output capacitor is coupled to the output of at least one of the drivers; and
- a matching network that is coupled to each output capacitor.

14. The apparatus of claim 13, wherein the plurality of drivers are arranged in a sequence, and wherein the switch network further comprises a plurality of switches, wherein each switch is coupled between outputs of consecutive drivers in the sequence.

15. The apparatus of claim 14, wherein each enable circuit further comprises:
- a first logic circuit that is coupled to the controller so as to receive at least one of the enable signals and that receives the first RF signal; and
- a second logic circuit that is coupled to the controller so as to receive at least one of the enable signals and that receives the second RF signal.

16. The apparatus of claim 15, wherein each driver further comprises:
- a PMOS transistor that is coupled at its gate to the first logic circuit of its corresponding enable circuit and that is coupled at its drain to its corresponding output capacitor; and
- an NMOS transistor that is coupled at its gate to the second logic gate of its corresponding enable circuit and that is coupled at its drain to its corresponding output capacitor.

17. The apparatus of claim 16, wherein the first and second logic circuits further comprise AND gates.

18. The apparatus of claim 17, wherein each switch further comprises a transmission gate.

19. The apparatus of claim 17, wherein each switch further comprises a microelectromechanical systems (MEMS) switch, a relay, or CMOS switch.

\* \* \* \* \*